United States Patent
Singh

(10) Patent No.: US 6,278,191 B1
(45) Date of Patent: Aug. 21, 2001

(54) BOND PAD SEALING USING WIRE BONDING

(75) Inventor: Inderjit Singh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/322,638

(22) Filed: May 28, 1999

(51) Int. Cl.[7] .................................................... H01L 23/48
(52) U.S. Cl. ........................ 257/780; 257/786; 257/738
(58) Field of Search .................................... 438/612, 617, 438/618, 619, FOR 343; 257/780, 782, 784, 786, 737, 738, 781; 228/4.5, 5.7, 110.1

(56) References Cited

U.S. PATENT DOCUMENTS

| | | | |
|---|---|---|---|
| 4,845,543 | * | 7/1989 | Okikawa et al. ...................... 357/67 |
| 5,186,381 | * | 2/1993 | Kim ..................................... 228/123 |
| 5,839,640 | * | 11/1998 | Kinnaird ............................... 228/4.5 |
| 5,871,141 | * | 2/1999 | Hadar et al. ........................ 228/180.5 |
| 5,898,226 | * | 4/1999 | Jeong et al. ......................... 257/786 |
| 5,984,162 | * | 11/1999 | Hortaleza et al. ................. 228/110.1 |
| 5,992,725 | * | 11/1999 | Egawa et al. ......................... 228/4.5 |

* cited by examiner

*Primary Examiner*—Don Wong
*Assistant Examiner*—Ephrem Alemu
(74) *Attorney, Agent, or Firm*—Beyer Weaver & Thomas, LLP

(57) ABSTRACT

A bond pad sealing arrangement and method that utilizes ball bonds to protect a bond pad is described. A relatively large free air ball is formed at a distal end of a bonding wire used for ball bonding. The free air ball is pressed against a bond pad and ultrasonically welded to form a ball bond. The bonding parameters utilized during the ball bonding are selected such that excess ball material passes is squashed outward beyond the capillary tip and overflows the periphery of the bond pad thereby completely covering and sealing the bond pad. The described structure works well to protect aluminum and other bond pads that are subject to corrosion if left exposed. In one preferred arrangement the capillary used to form the ball bond includes a cavity arrangement that molds a central portion of the ball bond to form a good intermetallic bond between the bond pad and the bonding wire.

7 Claims, 2 Drawing Sheets

US 6,278,191 B1

BOND PAD SEALING USING WIRE BONDING

CROSS REFERENCE TO RELATED APPLICATIONS

This application is related to application Ser. No. 08/890,354 filed Jul. 9, 1997; Ser. No. 08/784,271 filed Jan. 15, 1997; and Ser. No. 09/250,693 filed Feb. 16, 1999, each of which are incorporated herein by reference.

FIELD OF THE INVENTION

The present invention relates generally to wire bonding used in packaging semiconductor devices and the like. More particularly, the present invention relates to improved ball bonding techniques that may be used to protect device bond pads from oxidation after bonding.

BACKGROUND OF THE INVENTION

In the semiconductor industry, there are a number of different techniques that are used in the fabrication and packaging of integrated circuit devices. Although techniques vary extensively, most semiconductor devices have a number of bond pads on their top surface that serve as input/output (I/O) pads. The geometry of the bond pads is generally not considered critical, but the most common bond pad geometry is substantially square. A variety of different materials are used to form the bond pads, with one common material being aluminum. As is well known in the art, aluminum bond pads are somewhat prone to corrosion, especially if moisture penetrates to the bond pad.

During packaging of integrated circuits, the bond pads are typically electrically coupled to other components to facilitate connection to other integrated circuits or external devices. At the present time, wire bonding remains the dominant chip interconnection technology. In wire bonding, one end of a very fine wire is typically ultrasonically or thermosonically bonded to a bond pad and the other end is ultrasonically/thermosonically bonded to the component that the bond pad is to be electrically connected to (as for example a lead frame lead or a substrate trace). Generally the first end of the bonding wire is ball bonded to the bond pad using a wire bonding machine having a capillary that carries the bonding wire. During the ball bonding, it is generally considered important (if not imperative) that the capillary and thus the ball bond not contact the semiconductor passivation that surrounds the bond pad to avoid damaging the semiconductor device itself. Thus a portion of the bond pad remains exposed after wire bonding and the exposed portion of the bond pad is potentially subject to corrosion.

Currently, a number of techniques have been developed to seal or otherwise protect the bond pads from corrosion. However, there are always ongoing efforts to reduce the costs and improve the quality of packaging of semiconductor products. Accordingly improved techniques for sealing bond pads from corrosion would be desirable.

SUMMARY OF THE INVENTION

To achieve the foregoing and other objectives and in accordance with the present invention, a bond pad sealing arrangement and method that utilizes a ball bond to protect the bond pad is described. In a method aspect of the invention, a relatively large free air ball is formed at a distal end of the bonding wire used for ball bonding. The free air ball is pressed against a bond pad and ultrasonically welded to form a ball bond. The bonding parameters utilized during the ball bonding are selected such that excess ball material passes is squashed outward beyond the capillary tip and overflows the periphery of the bond pad thereby completely covering and sealing the bond pad. The described structure works well to protect aluminum and other bond pads that are subject to corrosion if left exposed.

In one preferred arrangement the capillary used to form the ball bond includes a cavity arrangement that molds a central portion of the ball bond to form a good intermetallic bond between the bond pad and the bonding wire.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well known processes, procedures, components, and circuits have not been described in detail so as not to unnecessarily obscure aspects of the present invention.

In general, the present invention contemplates forming ball bonds that have extensive flash portions. The flash is sized sufficiently to overflow the edges of the passivation material located adjacent the bond pads. A relatively large free air ball is formed at a distal end of the bonding wire used for ball bonding. The free air ball is pressed against a bond pad and ultrasonically welded to form a ball bond. The bonding parameters utilized during the ball bonding are selected such that excess ball material is squashed outward beyond the capillary tip and overflows the periphery of the bond pad thereby completely covering and sealing the bond pad. The described structure works well to protect aluminum and other bond pads that are subject to corrosion if left exposed.

Figure 1:
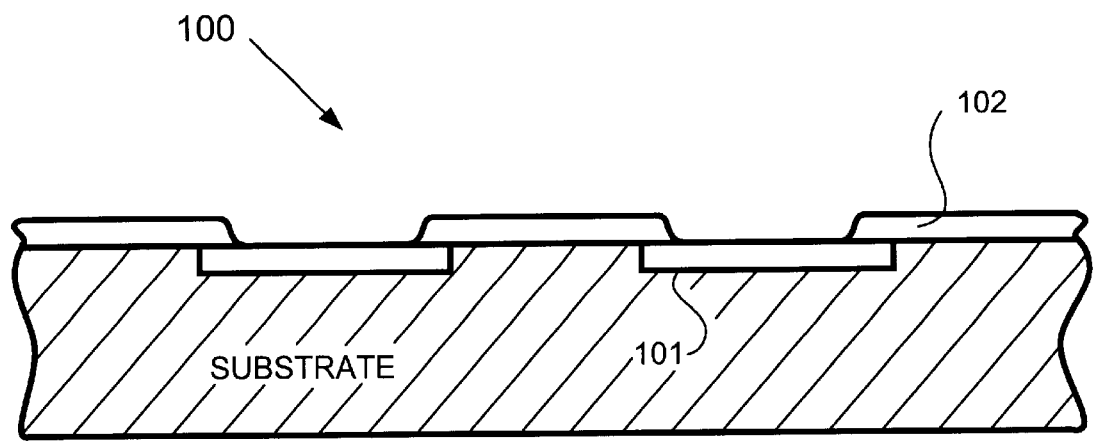
FIG. 1 is a diagrammatic cross sectional view of the surface portion of an integrated circuit having bond pads thereon.

Referring initially to FIG. 1, a top surface portion of a segment of a representative integrated circuit device 100 that includes a plurality of bond pads 101 on its top surface is illustrated. As is well known to those skilled in the art, a passivation layer 102 typically overlaps the edges of the bond pad to protect and electrically isolate the bond pads. The bond pads may be formed from any suitable material. By way of example, aluminum is one of the more popular bond pad materials, although any suitable material may be used and bond pad stacks composed of several different layers are also common. In the embodiment shown, the exposed portion of the bond pad is substantially circular, although again a variety of different bond pad geometry's may be used. As will be described in more detail below, one advantage of using circular bond pads is that they better match the shape of the ball bond flash than conventional square bond pads and therefore are easier to cover.

Figure 2:
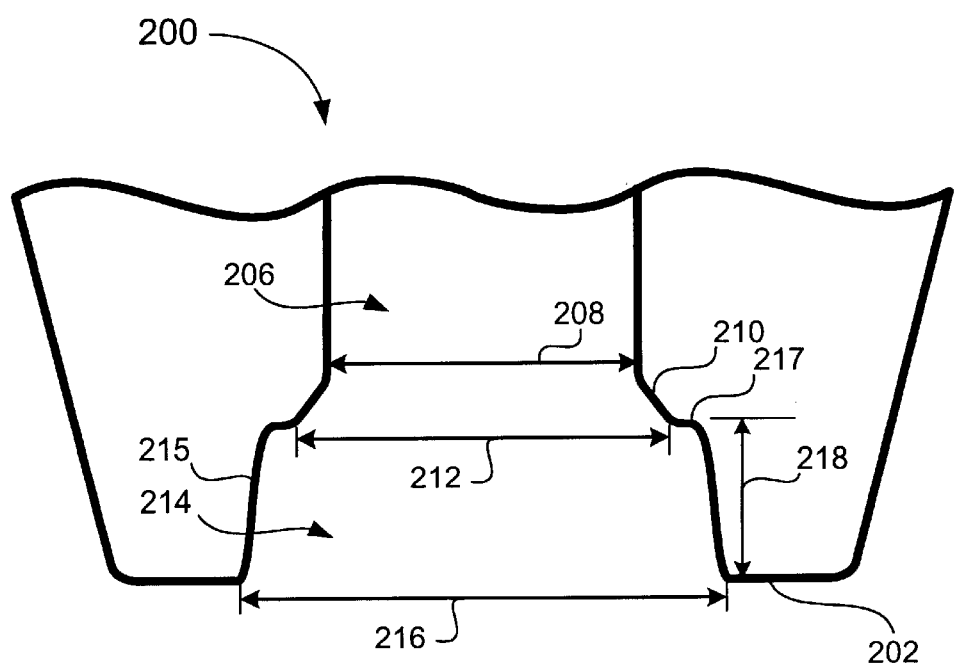
FIG. 2 is a diagrammatic cross sectional view of a capillary suitable for forming ball bonds in accordance with the present invention.

Referring next to FIG. 2, a diagrammatic vertical cross section of a tip portion 200 of a capillary suitable for implementing the present invention will be briefly described. The capillary 200 includes a wire feed bore 206 that has a chamfered opening into a recessed cavity 214 in the capillary tip surface 202. The geometry of the cavity 214 may be widely varied somewhat with the needs of a particular application and other capillary designs can readily be used as well. The illustrated capillary is described in more detail in the above referenced related applications which are incorporated herein by reference.

Figure 3:
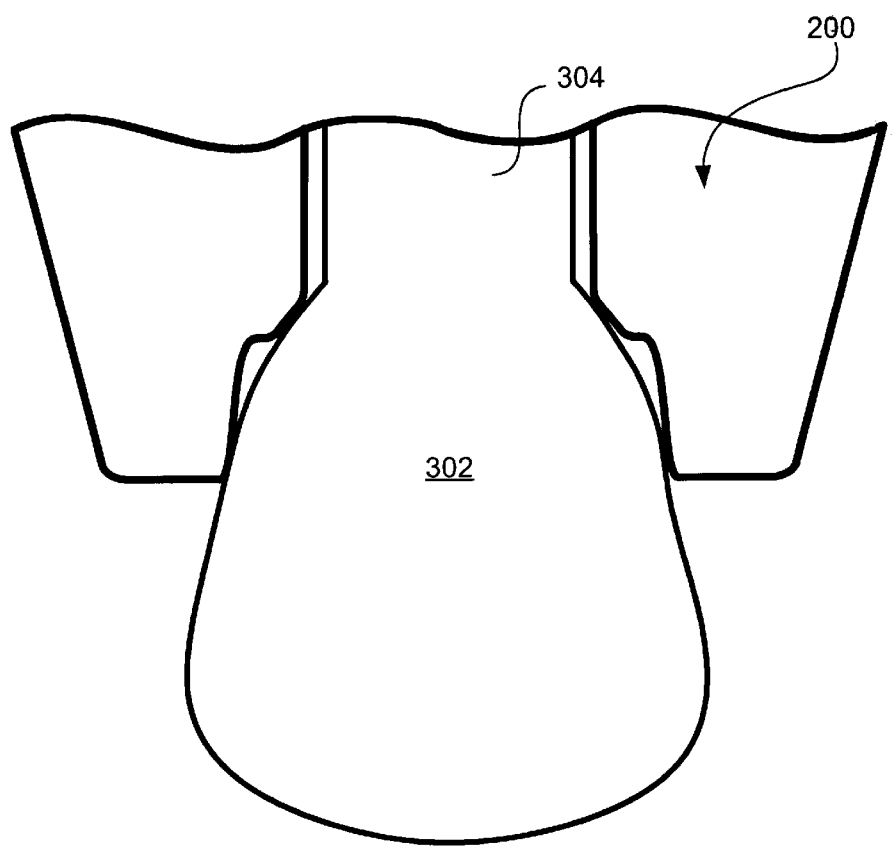
FIG. 3 is a diagrammatic cross sectional view of the capillary illustrated in FIG. 2 with a free air ball formed at the distal tip of the bonding wire.

To form a protective cap during ball bonding, a substantially enlarged free air ball is formed at the distal end of the bonding wire as best illustrated in FIG. 3. The bonding wire 304 may be formed from any suitable material, although as is well known to those skilled in the art, gold is most typical. Alternatively, aluminum or other materials may be used as well. The free air ball 302 has a free air ball diameter which may vary for a given volume based on the surface tension properties of the liquefied bonding material. An electric flame off (EFO) mechanism is used in conjunction with wire bonder hardware and software to create a free air ball 302 of a desired size. The desired size of the free air ball is calculated taking into consideration a number of factors as described in more detail below.

Figure 4:
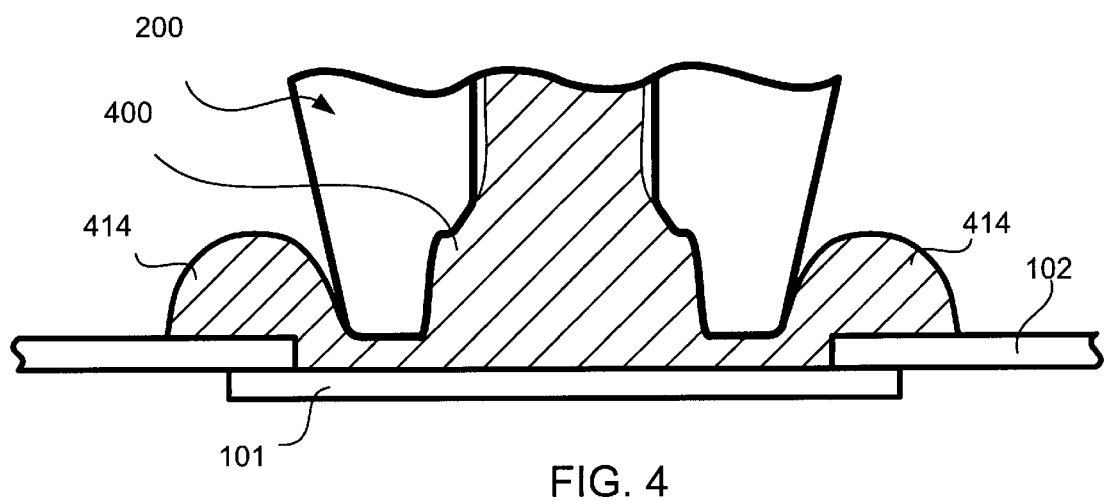
FIG. 4 is a diagrammatic cross sectional side view of a ball bond formed in accordance with one embodiment of the present invention.

In the embodiment shown, the EFO mechanism and other parameters are controlled so that the free air ball 302 has a volume significantly larger than the volume of the cavity 214 of the capillary 200. With this arrangement, when the capillary is positioned over a bonding surface, the free air ball is pressed against the bonding surface and a substantial amount of flash 414 is squished outwards beyond the end of the capillary tip 200 as illustrated in FIG. 4. The bonding wire 304 is then ultrasonically or thermosonically welded to the bond pad.

FIG. 4 shows a vertical cross section of a ball bond 400 formed by a wire bonding apparatus using capillary 200. The ball bond 400 is formed between the distal end of the bonding wire 304 and the bond pad 101. A wire bonding apparatus is used in conjunction with the capillary 200, and ultrasonic energy to form the ball bond 400. Optionally, thermal energy from a heating stage may also be used to form the ball bond 400.

By calculating the size of the free air ball appropriately, the amount of "flash" 414 (i.e. material that extends beyond the cavity diameter 216) can be relatively precisely controlled. Within the context of the invention, the amount of flash is controlled so that it will overflow the passivation layer 102 around the entire periphery of the bond pad. With this arrangement, the ball bond (together with its accompanying flash) completely covers the bond pad 101, thereby sealing the bond pad. It should be apparent that the sealed bond pad will be substantially less prone to corrosion than exposed bond pads.

The desired size of the free air ball 302 will be a function of a number of parameters including, the cavity and chamfer volume, the expected standoff distance between the capillary tip surface 202 and the bond pad (which may be a function of the surface tension of the bonding wire and the bonding force used during bonding, the bond pad size, the bonding power used during welding, etc. Of course, many of these parameters are interrelated and the actual parameters used may be widely varied.

It should be appreciated that a wide variety of capillary designs may be used to accomplish the described flash sealing of the bond pad. However, the illustrated capillary 200 and similar designs that include a cavity 214 that molds the ball bond 400 work particularly well. Specifically, the cavity walls 215 cooperate to mold a central portion of the ball bond 400 into a shape that is substantially similar to the shape of the cavity 214. Experiments have shown that the central portion of the ball bond (i.e. the region formed by the cavity 214) forms an extremely good bond with the bond pad 101 from much the same reasons as described in the reference U.S. application Ser. No. 09/250,693 which is incorporated herein by reference. More specifically, experiments have shown that the resulting bonds have a good intermetallic formation and good shear strength.

It should be appreciated that the actual dimensions and geometry of the capillary used to implement the present invention may be widely varied. By way of example, one specific implementation that has been found to work well on 90 micron diameter circular bond pads utilizes a capillary 200 having a cavity recess as illustrated in FIG. 2. The capillary 200 has a wire, which has a bore diameter 208 of approximately 30 microns, a capillary tip surface diameter of approximately 70 microns, a maximum cavity diameter 216 of approximately 50 microns, a maximum chamfer diameter of approximately 40 microns, and a cavity depth 218 in the range of approximately 10–15 microns.

The wire feed bore 206 includes a chamfer 210 that opens into the cavity 214. The chamfer 210 has smooth walls that splay outward towards its opening into the cavity 214. The chamfer angle may be varied depending on the needs of a particular application. By way of example, chamfer face angles (with respect to the vertical axis) between about 30 degrees and about 60 degrees have been found to work well. The corners of the chamfer 210 are typically rounded to prevent the presentation of sharp edges. In alternative embodiments, the chamfer 210 may be somewhat curved or the chamfer walls may be roughened. The chamfer 210 has a maximum chamfer diameter 212. The maximum chamfer diameter 212 can be varied depending on the needs of a particular wire bonding application.

A walled cavity 214 in the capillary tip 202 is adjacent to and continuous with the chamfer 210 and the wire feed bore 206. The cavity 214 defines cavity walls 215 and may include a recessed tip surface 217. The actual geometry of the cavity may be varied somewhat. By way of example, the cavity walls 215 may be domed, substantially frusto-conical or even substantially cylindrical (although some taper is generally preferred). By way of example, tapers in the range of approximately zero to 10° degrees, as for example, in the range of about 5–10° works well in a frusto-conical implementation. The cavity walls 215 preferably have a matte (roughened) surface to help hold the molten ball bond in place, although smooth walls may be used as well. It is noted that the use of a matte surface for the cavity walls 215 improves the shear strength of the resulting ball bonds. The recessed tip surface 217 may be tapered relative to a horizontal axis.

Although only a few embodiments of the present invention have been described in detail, it should be understood that the present invention may be embodied in many other specific forms without departing from the spirit or scope of the invention. Particularly, although the invention has been described primarily in the context of wire bonding using a capillary having a cavity as illustrated in FIG. 2, the diameter of the cavity 214 need not be greatly larger than the bonding wire bore diameter 208 and indeed one of the advantages of the present invention is that the bond quality appears to be quite good with relatively large variations in the respective ratios of the cavity diameter 216, bore diameter 208 and capillary tip diameter. Also, it is believed that good flash control and good bonding results can be obtained using a wide variety of capillary tip geometries including double chamfer, domed and double domed geometries.

The preferred bond pad geometry has been described as circular since that best matches the geometry of the footprint of most conventional ball bonds. However, it should be appreciated that the invention can be applied to bond pads having a wide variety of geometries including conventional square and rectangular geometries. The primary drawback of such bond pad geometries is that the total bond pad footprint diameter must be significantly increased to cover the corners of a square or rectangle, which may increase the required bond pad pitch (e.g. the spacing between adjacent bond pads) and/or increase the possibility of shorting between adjacent bond pads. Therefore, the present examples are illustrative and not restrictive, and the invention is not limited to the details given herein, but may be modified within the scope of the appended claims.

What is claimed is:

1. A method of sealing a bond pad having a surrounding adjacent passivation area during ball bonding using a capillary that has a capillary tip and a bonding wire that passes through the capillary, the method comprising:

forming a relatively large free air ball at a distal end of the bonding wire;

pressing the free air ball against the bond pad and ultrasonically welding the free air ball to the bond pad to form a ball bond, wherein bonding parameters utilized during the ball bonding are selected such that excess ball material is squashed radially outward beyond an outer perimeter of the capillary tip and overflows the adjacent passivation area thereby sealing the bond pad, the capillary having an enlarged recess therein and the capillary tip having a maximum diameter that is less than a minimum diameter of the passivation area.

2. A method as recited in claim 1 wherein the excess ball material that is squashed outward beyond the outer perimeter of the capillary tip is substantially free from any downward pressure applied from the capillary tip.

3. A method as recited in claim 1 wherein the bonding wire is formed from gold and a top surface of the bond pad is formed from aluminum.

4. A method as recited in claim 1 wherein the method is repeated to form a plurality of ball bonds, each ball bond being arranged to seal a corresponding bond pad opening.

5. A method as recited in claim 1 wherein the capillary includes a chamfer-cavity arrangement that molds a central portion of the ball bond to form a good intermetallic bond between the bond pad and the ball bond.

6. A method as recited in claim 1 wherein the exposed portion of the bond pad is substantially circular.

7. A method as recited in claim 1 wherein the passivation area is formed of a non-conductive material.

\* \* \* \* \*

UNITED STATES PATENT AND TRADEMARK OFFICE
CERTIFICATE OF CORRECTION

PATENT NO. : 6,278,191 B1 Page 1 of 1
DATED : August 21, 2001
INVENTOR(S) : Inderjit Singh It is certified that error appears in the above-identified patent and that said Letters Patent is hereby corrected as shown below:

Column 4,
Line 29, after "chamfer diameter" insert -- 212 --

Column 6,
Line 9, change "scaling" to -- sealing --

Signed and Sealed this

Thirtieth Day of July, 2002

*Attest:*

*Attesting Officer*

JAMES E. ROGAN
*Director of the United States Patent and Trademark Office*